United States Patent
Nishimura et al.

(10) Patent No.: US 10,635,005 B2
(45) Date of Patent: Apr. 28, 2020

(54) EXPOSURE APPARATUS, METHOD THEREOF, AND METHOD OF MANUFACTURING ARTICLE

(71) Applicant: CANON KABUSHIKI KAISHA, Tokyo (JP)

(72) Inventors: Mitsuhide Nishimura, Utsunomiya (JP); Masatoshi Endo, Utsunomiya (JP); Junichi Motojima, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/274,569

(22) Filed: Feb. 13, 2019

(65) Prior Publication Data

US 2019/0265599 A1 Aug. 29, 2019

(30) Foreign Application Priority Data

Feb. 28, 2018 (JP) .................. 2018-035418

(51) Int. Cl.
*G03F 7/20* (2006.01)
*G03F 9/00* (2006.01)

(52) U.S. Cl.
CPC ...... *G03F 7/70641* (2013.01); *G03F 7/70516* (2013.01); *G03F 7/70591* (2013.01); *G03F 7/70716* (2013.01); *G03F 7/70775* (2013.01); *G03F 9/7026* (2013.01); *G03F 9/7034* (2013.01)

(58) Field of Classification Search
CPC ............. G03F 7/70633; G03F 7/70725; G03F 7/70641

USPC ...................................... 355/53, 67
See application file for complete search history.

(56) References Cited

U.S. PATENT DOCUMENTS

| 2005/0179880 A1 | 8/2005 | Butler et al. |
| 2008/0291414 A1* | 11/2008 | Tsutsumi ............... G03B 27/42 355/53 |
| 2009/0153817 A1* | 6/2009 | Kawakubo ........... G03F 7/70633 355/53 |
| 2011/0273686 A1 | 11/2011 | Sato |
| 2013/0050668 A1 | 2/2013 | Kisteman |

(Continued)

FOREIGN PATENT DOCUMENTS

| JP | 2000208391 A | 7/2000 |
| JP | 2004111995 A | 4/2004 |

(Continued)

OTHER PUBLICATIONS

Extended European Search Report issued in European Appln. No. 19156220.6 dated Jul. 23, 2019.

(Continued)

*Primary Examiner* — Hung Nguyen
(74) *Attorney, Agent, or Firm* — Rossi, Kimms & McDowell LLP

(57) ABSTRACT

An exposure apparatus that exposes a substrate is provided. The apparatus includes a stage configured to hold and move the substrate, and a controller configured to control focus driving of the stage based on a measurement value and a correction value obtained for the focus driving of the stage for a shot region on the substrate. The controller is configured to determine the correction value in accordance with an angle of view at a time of exposure.

30 Claims, 9 Drawing Sheets

(56) References Cited

U.S. PATENT DOCUMENTS

2014/0240687 A1* 8/2014 Sato .................... G03F 7/70725
                                                              355/74
2015/0192867 A1  7/2015 Mai
2017/0139332 A1* 5/2017 Koizumi ............. G03F 7/70725

FOREIGN PATENT DOCUMENTS

| JP | 2006165216 A | 6/2006 |
| JP | 2011238707 A | 11/2011 |
| JP | 2015130407 A | 7/2015 |

OTHER PUBLICATIONS

Office Action issued in TW Application No. 108105552 dated Aug. 22, 2019. English translation provided.
Office Action issued in Japanese Appln. No. 2018-035418 dated Nov. 29, 2019.

* cited by examiner

FIG. 9

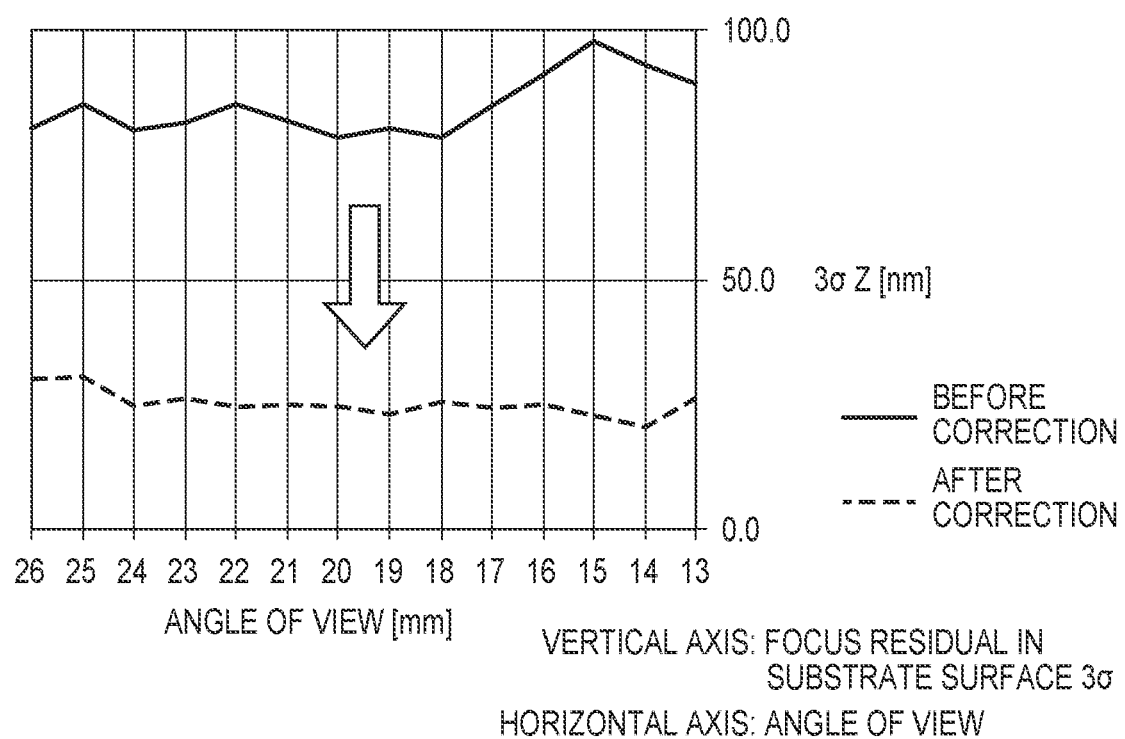

EXPOSURE APPARATUS, METHOD THEREOF, AND METHOD OF MANUFACTURING ARTICLE

BACKGROUND OF THE INVENTION

Field of the Invention

The present invention relates to an exposure apparatus, a method thereof, and a method of manufacturing an article.

Description of the Related Art

As an apparatus used in a manufacturing process (lithography process) of a semiconductor device or the like, there is an exposure apparatus that transfers a mask pattern to a substrate. In such an exposure apparatus, the surface of the substrate needs to be arranged accurately on an imaging plane (focus plane) of a projection optical system so a mask pattern will overlap a shot region on the substrate with high accuracy.

Japanese Patent Laid-Open No. 2015-130407 proposes, for a scan exposure apparatus that performs an exposure process by scanning a substrate, a method of correcting the misalignment of the substrate surface that has been caused by a manufacturing error of a control system, a measurement error of a measurement device, a control error of the control system, or the like. Japanese Patent Laid-Open No. 2004-111995 proposes, for an exposure apparatus employing a step-and-repeat method, a method of correcting the misalignment of the substrate surface in a direction (Z direction) parallel to an optical axis of a projection optical system which is caused by driving a substrate stage in a direction perpendicular (X-Y direction) to the optical axis. Japanese Patent Laid-Open No. 2000-208391 proposes, for an exposure apparatus employing the step-and-repeat method, a method of performing focus measurement accurately before the exposure region is reached.

Generally, in an exposure apparatus, a focusing operation of arranging a substrate surface on a focus plane is performed by feedback control to increase the accuracy. On the other hand, increasing the speed of the focusing operation is an important requirement for improving throughput. To improve the throughput, it is possible to consider using methods such as increasing the acceleration of the movement of a substrate stage, performing focus measurement in advance by relaxing the settling tolerance of the substrate stage, or the like. However, in such a case, measurement errors can increase since the focus measurement will be performed in a state in which a deviation of the substrate stage is left with respect to a target position. Hence, a more effective correction is required.

SUMMARY OF THE INVENTION

The present invention provides, for example, an exposure apparatus advantageous in improving focus accuracy.

The present invention in its one aspect provides an exposure apparatus that exposes a substrate, comprising a stage configured to hold and move the substrate, and a controller configured to control focus driving of the stage based on a measurement value and a correction value obtained for the focus driving of the stage for a shot region on the substrate, wherein the controller is configured to determine the correction value in accordance with an angle of view at a time of exposure.

Further features of the present invention will become apparent from the following description of exemplary embodiments (with reference to the attached drawings).

BRIEF DESCRIPTION OF THE DRAWINGS

FIG. 9 is a view showing a display example of a correction formula result for each angle of view; and FIG. 10 is a graph for explaining an effect of the embodiment.

DESCRIPTION OF THE EMBODIMENTS

Various exemplary embodiments, features, and aspects of the invention will be described in detail below with reference to the drawings.

Embodiments of the present invention will be described in detail below with reference to the accompanying drawings. Note that the following embodiments are merely specific examples of the embodiments of the present invention, and do not limit the present invention. In addition, not all combinations of characteristic features described in the following embodiments are essential to the solution of the problem in the present invention.

Figure 1:
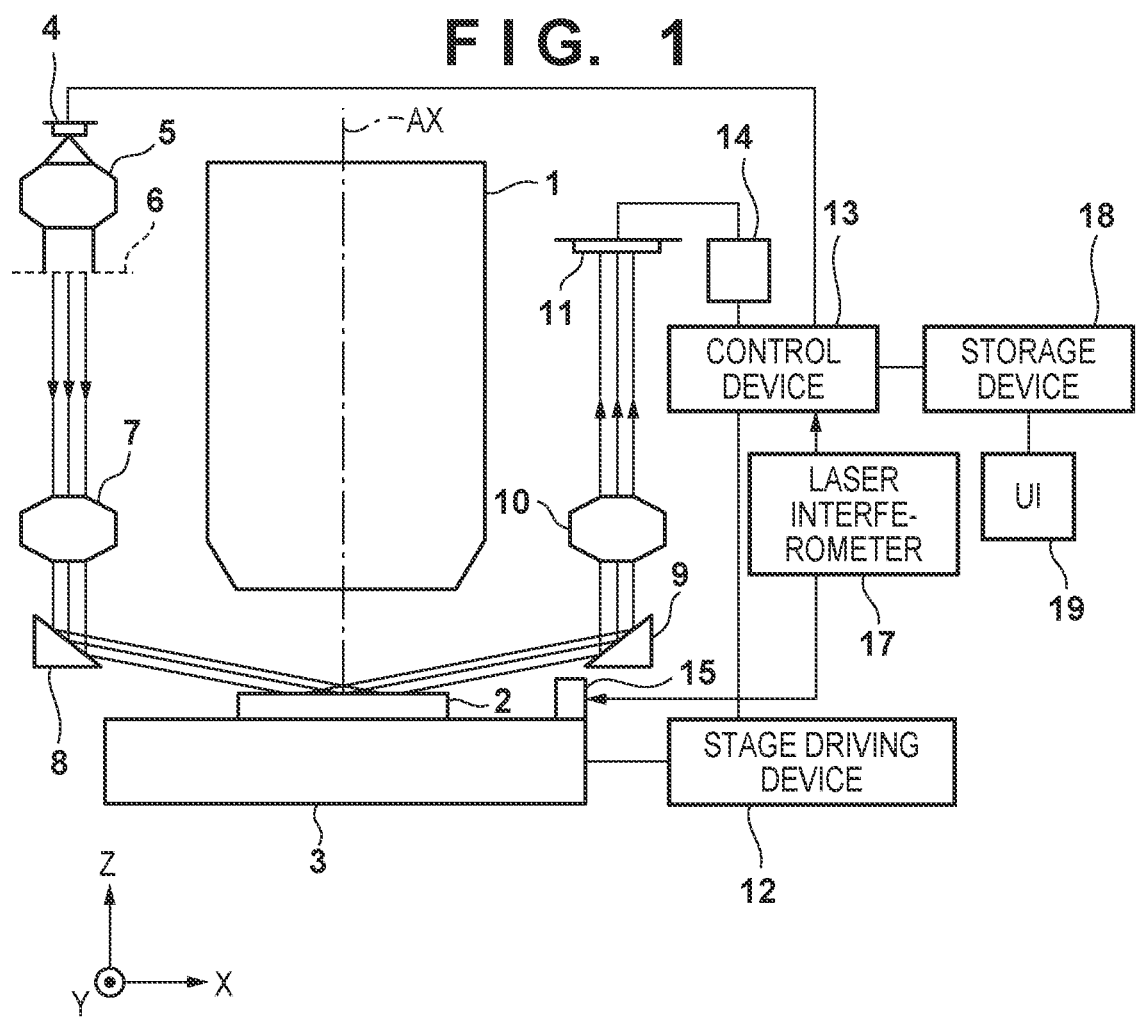
FIG. 1 is a view showing the arrangement of an exposure apparatus according to an embodiment.

FIG. 1 is a view showing the arrangement of a reduction projection exposure apparatus which employs a step-and-repeat method according to the embodiment. A projection optical system 1 reduces and projects a circuit pattern of a reticle (not shown) and forms a circuit pattern image on a focal plane. In addition, an optical axis AX of the projection optical system 1 in a parallel relationship with a Z-axis direction in FIG. 1. A plurality of exposure target regions (shot regions) on which a photoresist has been applied and the same pattern has been formed by a preceding exposure process are arranged on a substrate 2. A substrate stage 3 that holds the substrate 2 includes an X stage that moves in an X-axis direction perpendicular to a Z-axis, a Y stage that moves in a Y-axis direction perpendicular to the Z-axis and an X-axis, and a Z stage that moves in a Z-axis direction and rotates about a shaft parallel to the X-, Y-, and Z-axes directions. Hence, by driving the substrate stage 3, the surface position of the substrate 2 can be adjusted in the direction of the optical axis AX of the projection optical system 1 and in a direction along a plane perpendicular to the optical axis AX, and a tilt with respect to a focal plane, that is, a circuit pattern image can also be adjusted.

Figure 2:
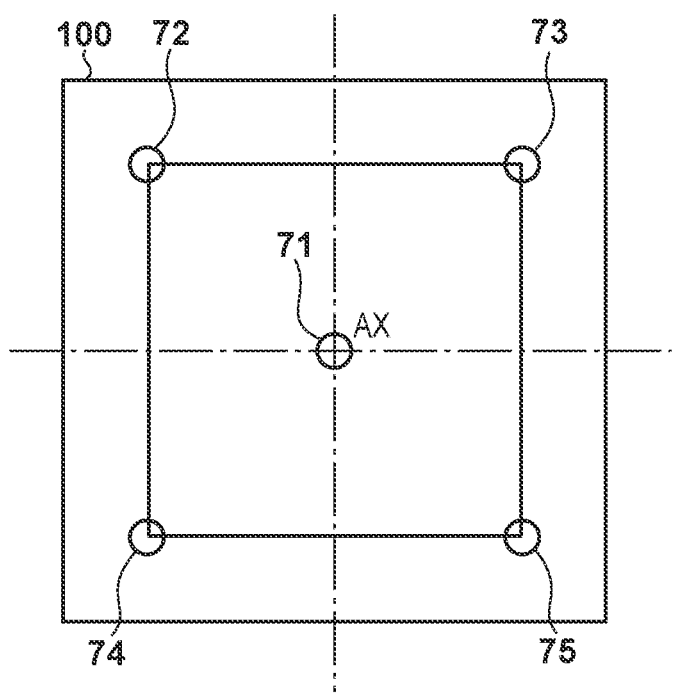
FIG. 2 is a view showing an example of measurement points arranged on a target exposure region.

Reference numerals 4 to 11 denote elements of a detection optical system provided to detect the position and the tilt of the substrate 2. Reference numeral 4 denotes an illumination light source with high luminance such a light-emitting diode, a semiconductor laser, or the like, and reference numeral 5 denotes an illumination lens. Light emitted from the illumination light source 4 is converted into a parallel light beam by the illumination lens 5, is converted into a plurality of light beams via a mask 6, enters a bending mirror 8 via an imaging lens 7, and enters the surface of the substrate 2 after its direction is changed by the bending mirror 8. That is, the imaging lens 7 and the bending mirror 8 form a plurality of pinhole images of the mask 6 on the substrate 2. As shown in FIG. 2, the light beams that have passed through this plurality of pinholes irradiate five measurement points 71, 72, 73, 74, and 75 including the center (a position corresponding to the optical axis AX) of a target exposure region 100 of the substrate 2, and the light beams are reflected at the respective points. In the example shown in FIG. 2, the measurement point 71 is at the center of target exposure region 100 which intersects with the optical axis AX, and the other measurement points 72, 73, 74, and 75 are positioned at equal intervals away from the measurement point 71 as the center. The direction of each of the light beams reflected by the five measurement points 71, 72, 73, 74, and 75 in the target exposure region 100 is changed by a bending mirror 9, and the light beams subsequently enter a position sensitive detector 11, on which elements are two-dimensionally arranged, via the detection lens 10. In this manner, the imaging lens 7, the bending mirror 8, the substrate 2, the bending mirror 9, and the detection lens 10 form pinhole images of the mask 6 on the position sensitive detector 11. Therefore, the mask 6, the substrate 2, and the position sensitive detector 11 are at positions which are optically conjugate to each other.

Although the position sensitive detector 11 is shown schematically in FIG. 1, a plurality of the position sensitive detector 11 may be arranged in correspondence with the pinholes in a case in which it is difficult to implement an optical arrangement such as that shown in FIG. 1. For example, the position sensitive detector 11 is formed from a two-dimensional CCD or the like, and is capable of separately detecting the positions of the plurality of light beams incident, via the plurality of pinholes, on the light receiving surface of the position sensitive detector 11. The positional changes of the substrate 2 in the optical axis AX with respect to the projection optical system 1 can be detected as shifts in the incident positions of the plurality of light beams on the position sensitive detector 11. The pieces of optical axis AX direction positional information of the surface of the substrate 2 obtained from the five measurement points 71 to 75 in the target exposure region 100 of the substrate 2 are input as output signals from the position sensitive detector 11 to a control device 13 via a surface position detection device 14.

The displacement of the substrate stage 3 in the X-axis direction and the Y-axis direction can be measured by a known method by using a reference mirror 15 and a laser interferometer 17 arranged on the substrate stage 3. A signal indicating the displacement amount of the substrate stage 3 is input from the laser interferometer 17 to the control device 13 via a signal line. A stage driving device 12 controls the movement of the substrate stage 3. The stage driving device 12 receives an instruction signal from the control device 13 via a signal line and drives the substrate stage 3 by servo drive in response to this signal. The stage driving device 12 includes a first driving unit and a second driving unit. The first driving unit adjusts positions x and y and a rotation θ in a surface perpendicular to the optical axis AX of the substrate 2, and the second driving unit adjusts a position z, a tilt α, and a tilt β related to the optical axis AX direction (Z direction) of the substrate 2. The surface position detection device 14 detects the surface position of the substrate 2 based on each output signal (surface position data) from the position sensitive detector 11 and transfers the detection result to the control device 13. Based on the detection result obtained by the surface position detection device 14, the control device 13 transmits a predetermined instruction signal to cause the second driving unit of the stage driving device 12 to operate and adjusts the position and the tilt related to the optical axis AX direction of the substrate 2. A storage device 18 can store the data required to drive the stage. Note that the storage device 18 may be a memory formed in the control device 13. A user interface 19 can include a console unit for a user to make an operation related to parameter settings, a display unit to display parameters related to stage driving, and the like.

As described above, the control device 13 performs feedback control, via the stage driving device 12, by arranging the substrate surface on a focus plane when the substrate stage 3 is driven in the Z direction. In this case, to improve the throughput, operations such as increasing the acceleration of the movement of the substrate stage 3, performing the focus measurement in advance by relaxing the settling tolerance of the substrate stage 3, and the like can be considered. However, in such a case, measurement errors can increase because focus measurement will be performed in a state in which a deviation of the substrate stage 3 is left with respect to the target position. Hence, the control device 13 needs to correct an instruction value and output the corrected instruction value to the stage driving device 12. The deviation of the measurement value of the substrate stage which is left with respect to the target value in the above-described manner is referred to as a "focus residual" here. According to the examinations by the inventors, it has become evident that this focus residual changes depending on the exposure angle of view (step size). It has also become evident that the focus residual changes depending on the step direction and the position of an exposure target shot region on the substrate. Hence, in this embodiment, the control device 13 will obtain a correction formula corresponding to the angle of view, the step direction, and the position of the target shot region on the substrate. Therefore, the control device 13 will perform processing to calculate a focus correction formula.

Figure 3:
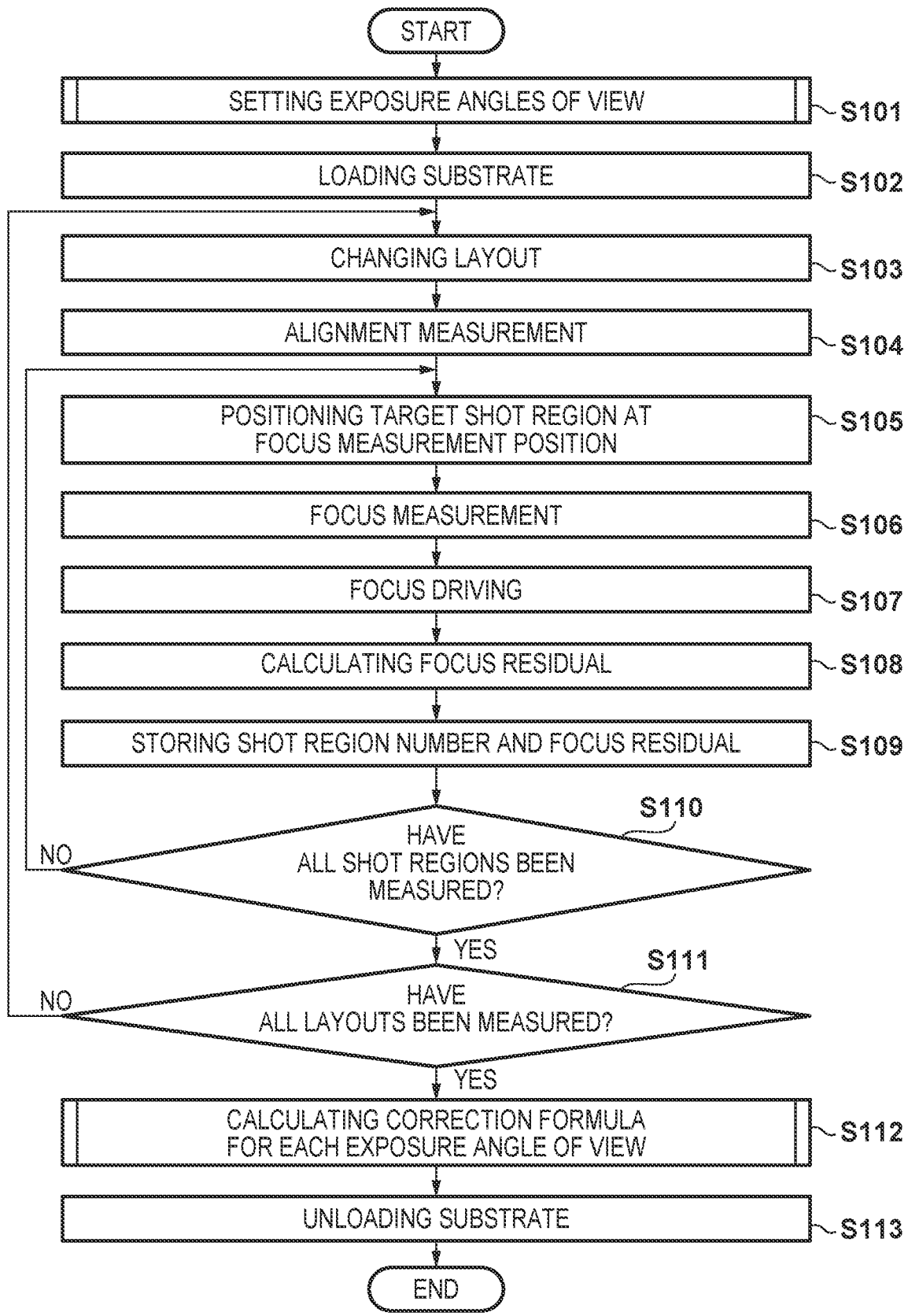
FIG. 3 is a flowchart of focus correction formula calculation processing according to the embodiment.

FIG. 3 is a flowchart of the focus correction formula calculation processing which is executed by the control device 13. Although this processing is executed before the exposure process, this processing need not be performed immediately before the exposure process, and the control device 13 need only store the information related to the calculated correction formula in the storage device 18.

Figure 4:
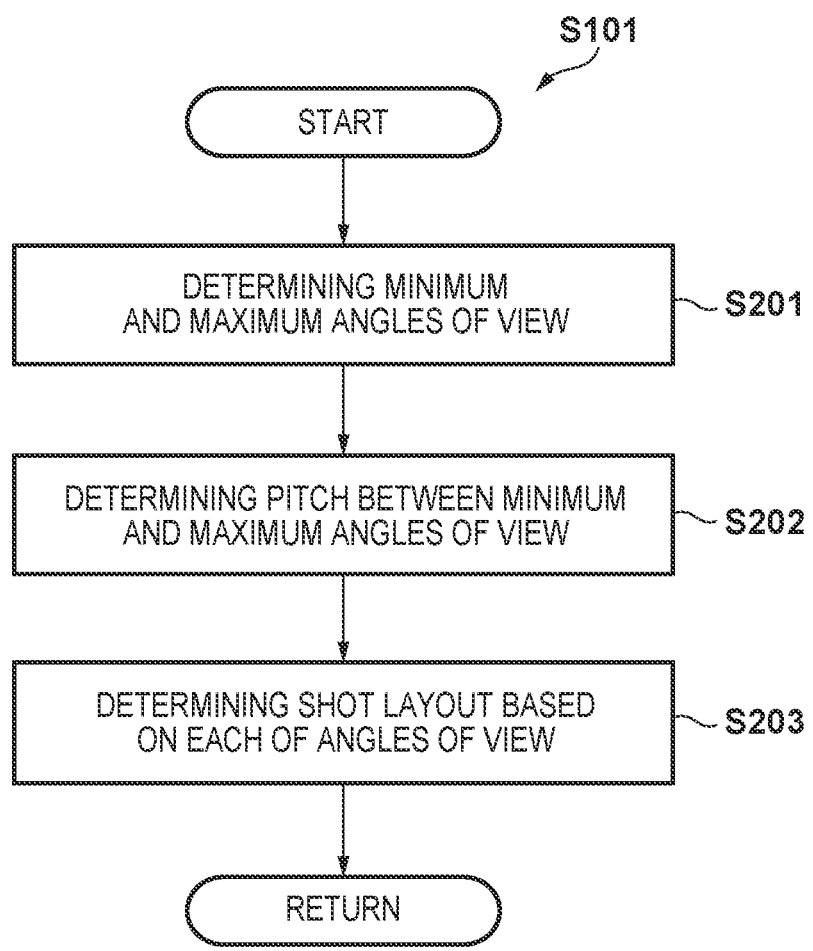
FIG. 4 is a flowchart of processing for determining an exposure angle of view.
Figure 5:
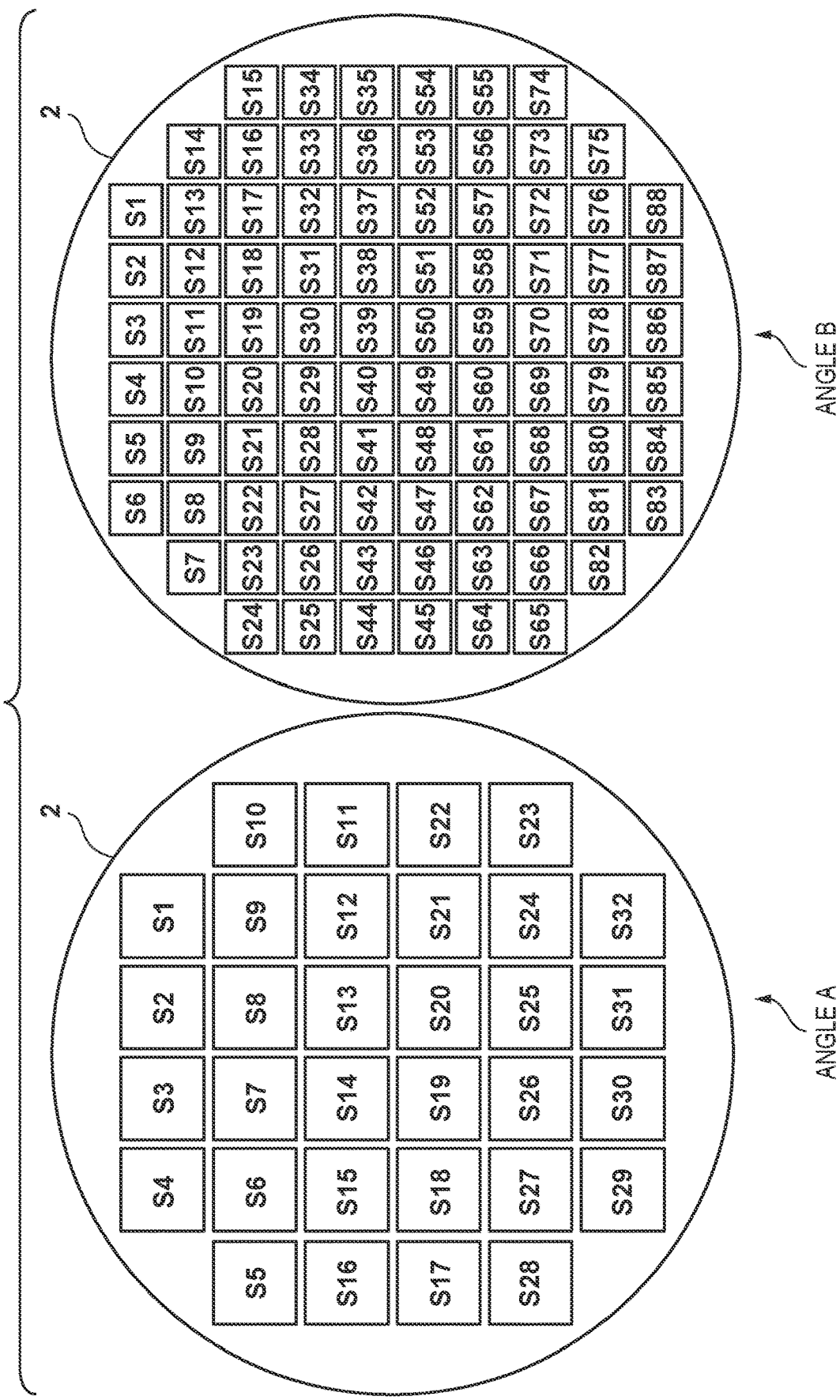
FIG. 5 is a view showing an example of shot layouts obtained from different angles of view.

In step S101, the control device 13 determines a plurality of angles of view each of which is a condition for calculating the correction formula. FIG. 4 is a flowchart of the processing performed to determine a plurality of candidate angles of view. The control device 13 determines, in step S201, the minimum value and the maximum value among the angles of view to be set as candidates, and determines, in step S202, the pitch of angles of view between the determined minimum angle of view and the maximum angle of view. These values may be determined by the user. The control device 13 determines, in step S203, a shot layout based on each of the plurality of angles of view obtained in accordance with the minimum value, the maximum value, and the pitch of the angle of view determined in steps S201 and S202. The determined plurality of angles of view and/or shot layouts are stored in the storage device 18. FIG. 5 shows an example of a shot layout by an angle A of view and an example of a shot layout by an angle B of view smaller than the angle A of view. An example of layouts for correction formula calculation calculated in FIG. 4 is shown. Since the angle B of view is smaller than the angle A of view, the number of shot regions formed by the angle B of view is more than the number of shot regions formed by the angle A of view.

The description will be made by referring back to FIG. 3. In step S102, the substrate 2 is conveyed into the apparatus and mounted on the substrate stage 3. In step S103, the control device 13 changes the exposure layout in step S103 in accordance with the angle of view determined in step S101. The control device 13 performs alignment measurement in step S104, drives the substrate stage 3 (drives the substrate stage in a horizontal direction with respect to the image plane) so that the target shot region will come to the focus measurement position in step S105, and performs the focus measurement in step S106. In step S107, the control device 13 executes a focus driving operation (drives the substrate stage in a vertical direction with respect to the image plane) in accordance with the focus target value and the focus measurement value measured in step S106. In step S108, the control device 13 calculates, as a focus residual, the difference of the focus measurement value from the focus target value. In step S109, the control device 13 associates the identification number of the target shot region with the focus residual calculated in step S108 and stores the associated identification number and the focus residual in the storage device 18. The position of the shot region on the substrate can be specified based on the identification number of the shot region. In step S110, the control device 13 determines whether the measurement has been completed for all of the shot regions. If the measurement has not been completed, the processes of steps S105 to S109 are repeated for the next shot region. If the measurement has been completed for all of the shot regions, the control device 13 determines, in step S111, whether the measurement has been completed for all of the layouts determined in step S101. If the measurement has not been completed, the process will return to step S103 to repeat the processes for the measurement of the next layout. If the measurement has been completed for all of the layouts, the control device 13 calculates the correction formula in step S112.

Figure 6:
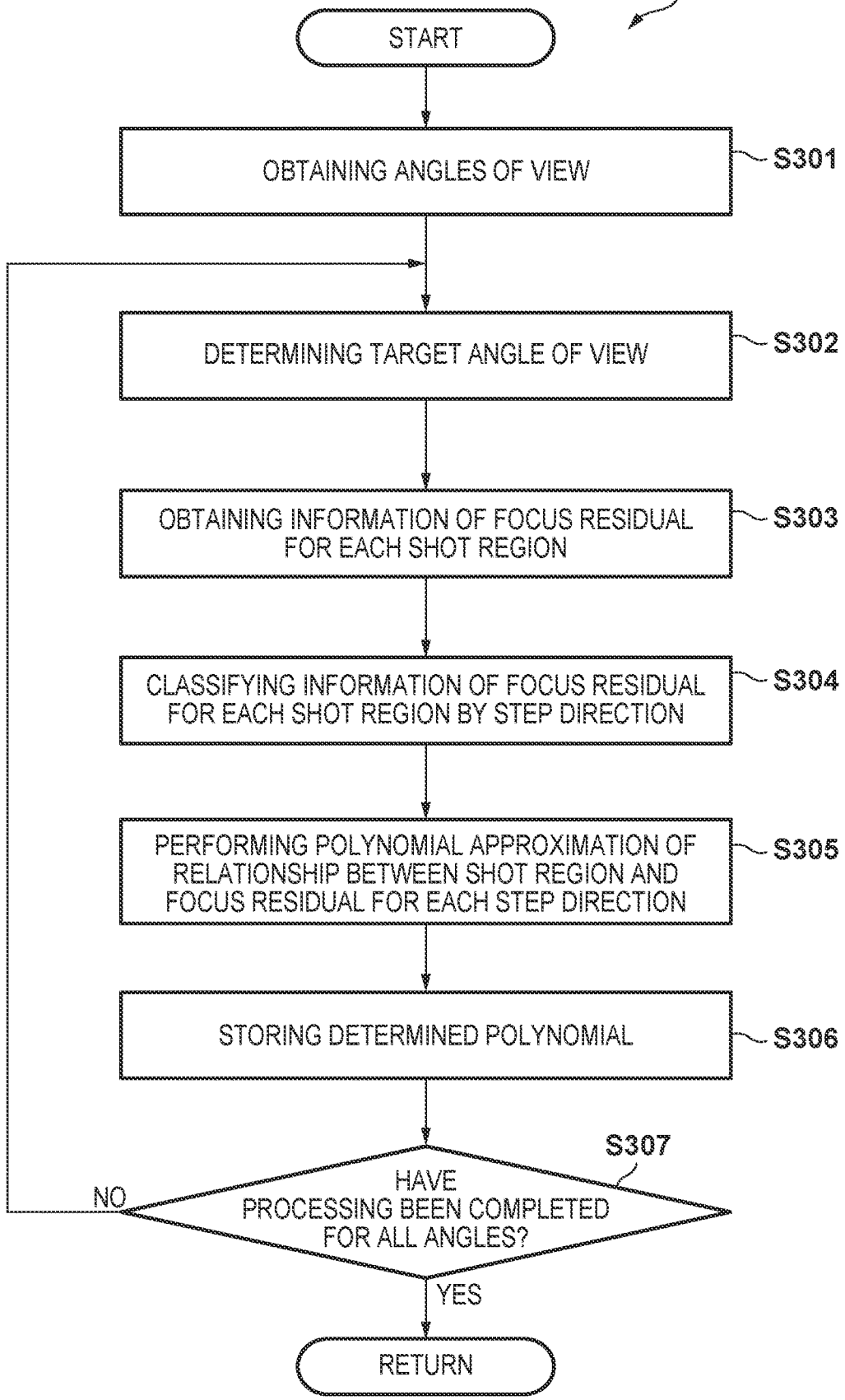
FIG. 6 is a flowchart illustrating correction formula calculation processing.

FIG. 6 is a flowchart illustrating correction formula calculation processing performed in step S112. In step S301, the control device 13 obtains the plurality of angles of view determined in step S101. In step S302, the control device 13 determines the angle of view to be set as the processing target from the obtained plurality of angles of view. Processing related to the angle of view determined in step S302 will be performed in the following processes of steps S303 to S306. In step S303, the control device 13 obtains the information of the focus residual for each shot region stored in the storage device 18. Next, in step S304, the control device 13 classifies the obtained information of the focus residual for each shot region in accordance with the step direction (the plus direction/the minus direction) of the substrate stage 3. In step S305, the control device 13 performs a polynomial approximation of the relationship between the shot region and the focus residual for each step direction, and stores the obtained result in the storage device 18 (S306). In step S307, the control device 13 determines whether the processing has been performed for all of the angles of view. If the processing has not been completed for all of the angles of view, the process returns to step S303, and the processing is repeated for the next angle of view. The correction formula is calculated for each angle of view in this manner.

Referring back to FIG. 3, in step S113, the substrate is unloaded, and the processing ends. To summarize the key points of the correction formula calculation processing performed before the exposure process, the correction formula calculation processing includes the following measurement processes. (a) A process of performing focus measurement to obtain a measurement value for the focus driving operation of the substrate stage (step S106). (b) A process of performing a focus driving operation in accordance with the obtained measurement value (step S107). (c) A process of performing focus measurement after the completion of the focus driving operation and calculating a residual of the measurement value obtained by the focus measurement with respect to the target value. In the measurement process, the above-described processes (a) to (c) are repeated for each shot region for each of the plurality of angles of view. In addition, in the correction formula calculation processing, a plurality of correction formulas are calculated (step S112) based on the residual for each shot region obtained for each of the plurality of angles of view based on the measurement process described above.

Figure 7:
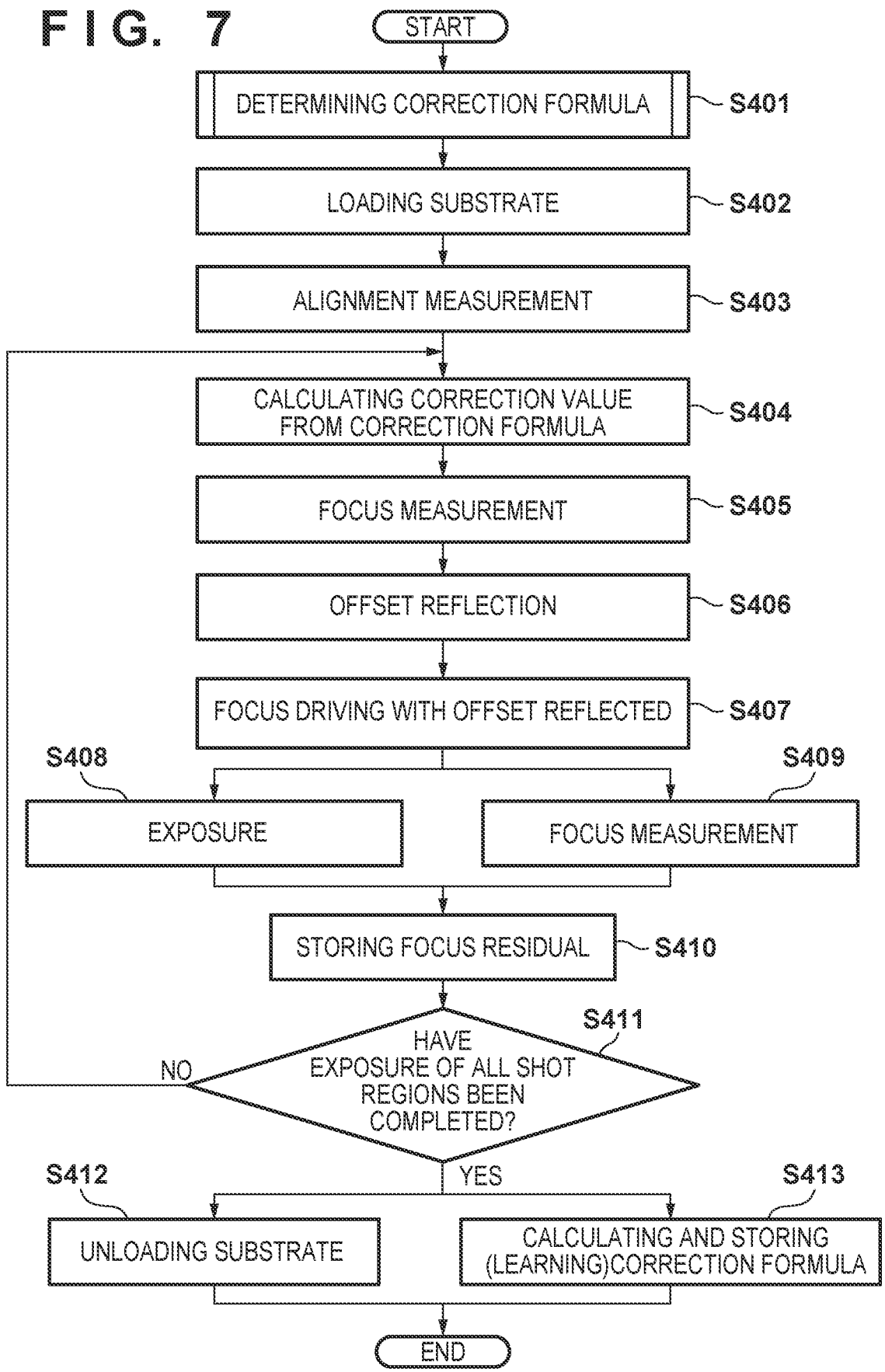
FIG. 7 is a flowchart illustrating an exposure process.
Figure 8:
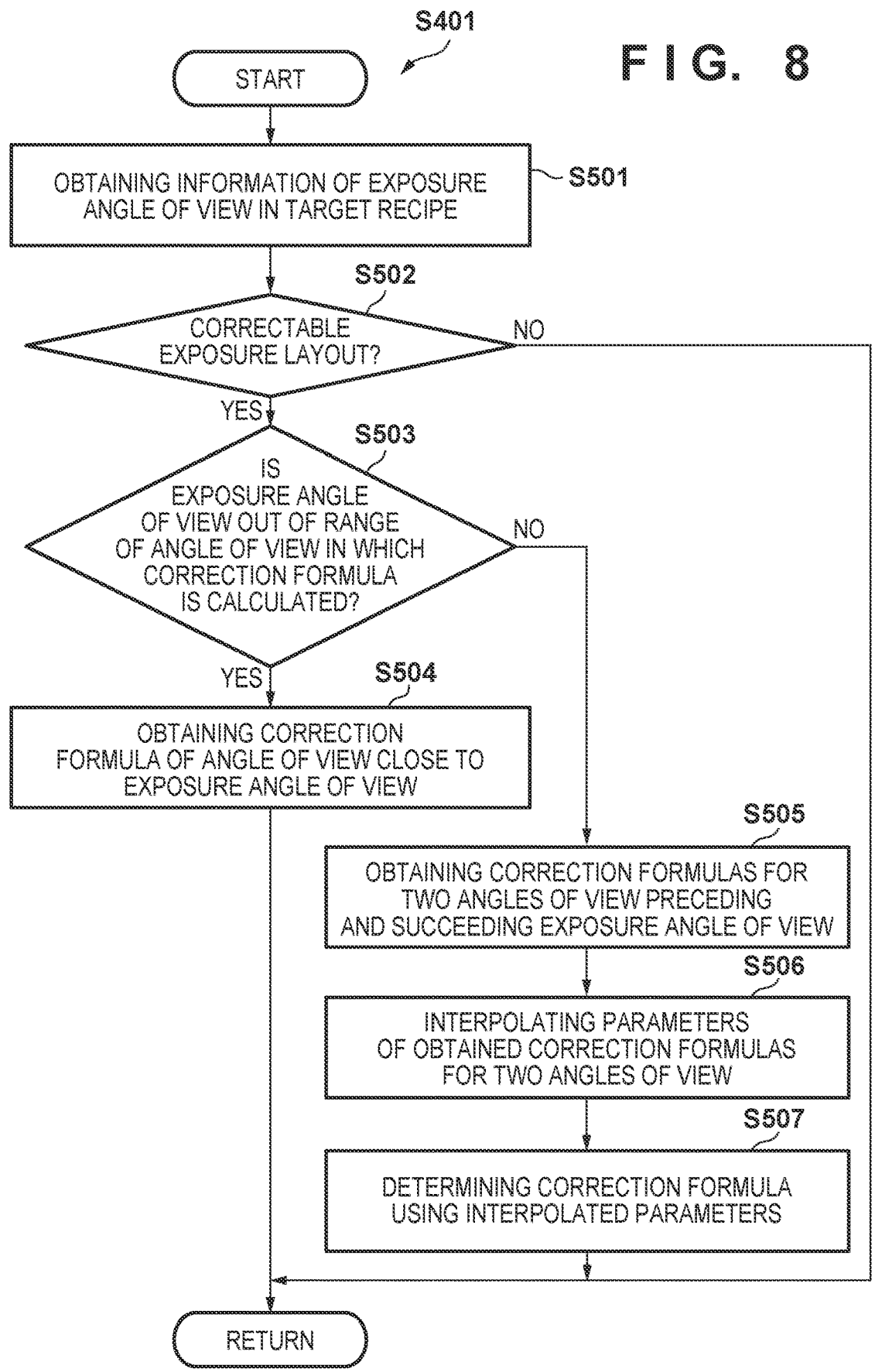
FIG. 8 is a flowchart illustrating the correction formula calculation processing in the exposure process.

The exposure process according to the embodiment will be described next with reference to the flowchart of FIG. 7. First, in step S401, the control device 13 calculates the correction formula corresponding to the exposure layout. FIG. 8 shows a flowchart of the correction formula calculation processing performed in step S401. In step S501, the control device 13 obtains the information of the angle of view (that is, the layout) at the time of exposure from the target exposure recipe. In step S502, the control device 13 determines whether the obtained layout can be corrected. For example, this is determined by whether the main driving direction of the substrate stage is the same under the layout and exposure conditions set when the correction formula was obtained. If it is determined that obtained layout cannot be corrected, 0 is set as the coefficient of the correction formula. If it is determined that the obtained layout can be corrected, the control device 13 confirms, in step S503, whether the angle of view at the time of exposure obtained in step S501 falls outside the range between the maximum value and the minimum value of the plurality of angles of view determined in step S101. If the angle of view obtained in step S501 falls outside the range, the correction formula of an angle of view closest to the exposure angle of view will be obtained in step S504 from the plurality of angles of view determined in step S101. That is, in a case in which the angle of view at the time of exposure is smaller than the minimum angle of view of the plurality of the angles of view, the correction formula for the minimum angle of view will be determined as the correction formula for the angle of view at the time of exposure. Also, in a case in which the angle of view at the time of exposure is larger than the maximum angle of view of the plurality of the angles of view, the correction formula for the maximum angle of view will be determined as the correction formula for the angle of view at the time of exposure.

On the other hand, if the angle of view obtained in step S501 falls within the range, the correction formulas used for the two angles of view preceding and succeeding the exposure angle of view will be obtained in step S505. For example, if the plurality of angles of view determined in step S101 have been obtained at a pitch of 1.0 mm and the exposure angle of view obtained in step S501 corresponds to 22.5 mm, the correction formulas used for the two angles of view corresponding to 23.0 mm and 22.0 mm preceding and succeeding the exposure angle of view corresponding to 22.5 mm will be obtained. In step S506, the control device 13 performs interpolation of parameters of the correction formulas used for the two angles of view obtained in step S505. In step S507, the control device 13 determines the correction formula corresponding to the angle of view at the time of exposure using the interpolated parameters.

In the following example, the correction formula will be have a degree of one for the sake of descriptive convenience, and linear approximation will be performed by using the two angles of view preceding and succeeding the obtained exposure angle of view to calculate the correction formula. When the correction formula of the exposure angle of view corresponding to 22.5 mm is to be obtained, the interpolation correction formula is calculated from the correction formulas of the angle of view corresponding to 23.0 mm ($Z=5.0X+10.0$) and the angle of view corresponding to 22.0 mm ($Z=10.0X+20.0$). However, assume that X is a position of the shot region in the X direction of the substrate and that Z is the Z direction correction value. The coefficients of the two correction formulas are linearly interpolated and the intercepts are linearly interpolated. As a result, the correction formula of the exposure angle of view corresponding to 22.5 mm is $Z=7.5X+15$.

Referring back to FIG. 7, the substrate is loaded in step S402, and alignment measurement is performed in step S403. The control device 13 calculates, in step S404, the Z-direction correction value of each shot region from the correction formula corresponding to the exposure angle of view calculated in step S401. In step S405, the control device 13 performs focus measurement. In step S406, the control device 13 reflects, as an offset, the correction value obtained in step S404 on the instruction value of the substrate stage, and the control device 13 executes focus driving in step S407. After the completion of the focus driving, the control device 13 performs the exposure process in step S408. The control device 13 performs, in step S409, the focus measurement during the exposure process and stores (learns), in step S410, the focus residual.

In step S411, the control device 13 determines whether all of the exposure-target shot regions have been exposed. If the exposure process has not been completed for all of the shot regions, the process returns to step S404, and the processing is repeated for the next shot region which has not been exposed yet. When the exposure process has been completed for all of the shot regions, the correction formula of the newly used exposure angle of view is calculated in step S413 simultaneously with the unloading of the substrate in step S412. The newly calculated correction formula is stored in the same manner as the correction formula obtained and stored in FIG. 6. As a result, the interpolation correction formula calculation accuracy is improved.

Figure 9:
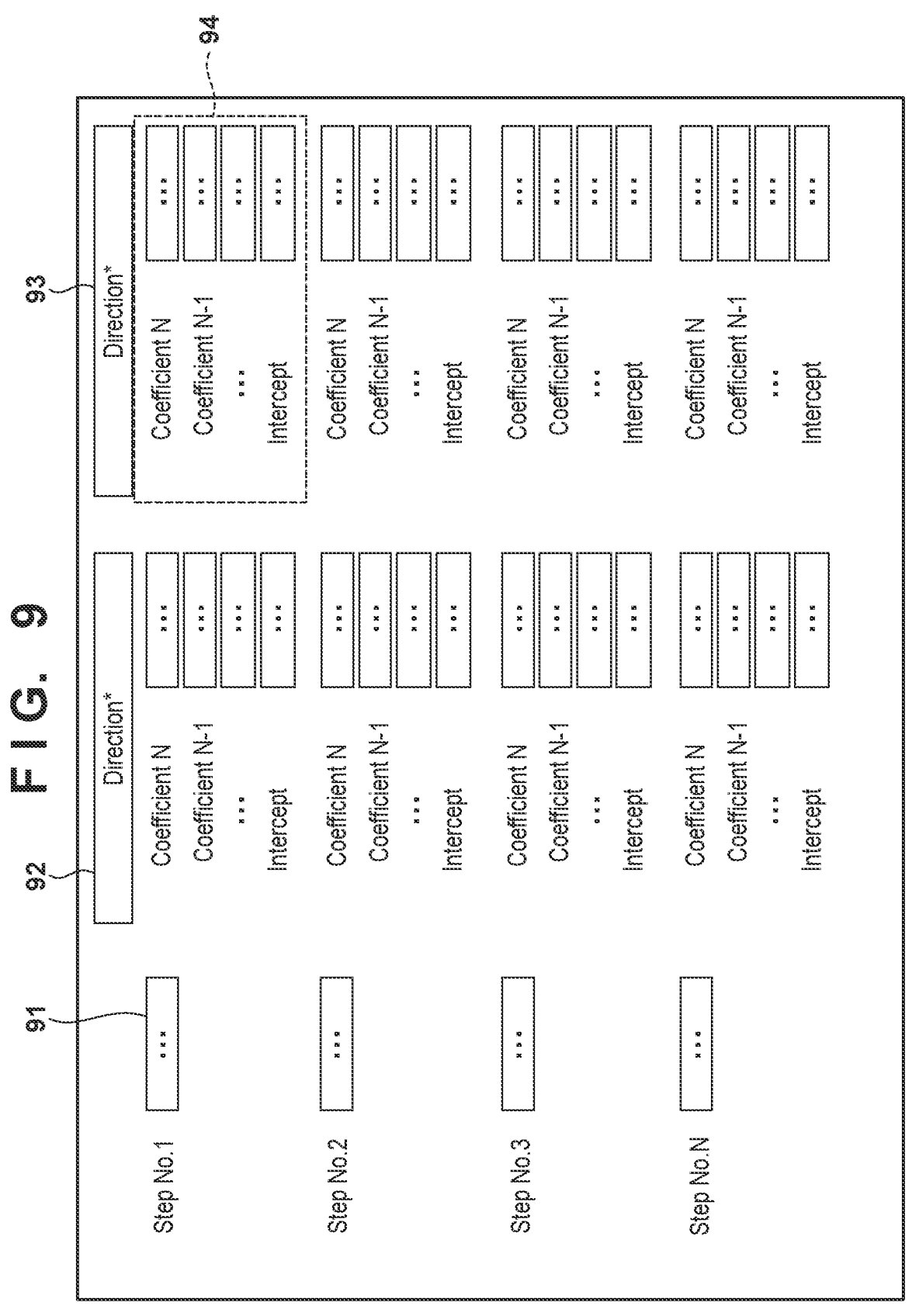

FIG. 9 shows an example of the correction formula result for each angle of view calculated in step S112 that is displayed by the user interface 19. An item 91 shows the angle of view. Items 92 and 93 each show the step direction of the substrate stage. An item 94 shows the calculated correction coefficient. Each coefficient of the correction formula obtained by function approximation is expressed as a "Coefficient", and each intercept is expressed an "Intercept".

FIG. 10 is a chart showing the correction result according to the embodiment. In FIG. 10, the abscissa indicates the angle of view of which the focus residual has been obtained, and the ordinate indicates a focus residual 3σ within the substrate surface. As shown in FIG. 10, since focus residual correction can be performed for all of the exposure angles of view according to this embodiment, it is possible to improve the focus accuracy for each angle of view.

<Embodiment of Method of Manufacturing Article>

A method of manufacturing an article according to an embodiment of the present invention is suitable for manufacturing an article, for example, a microdevice such as a semiconductor device or an element having a microstructure. The method of manufacturing an article according to this embodiment includes a step of forming, using the above-described exposure apparatus, a latent image pattern on a photoresist applied to a substrate (a step of exposing a substrate), and a step of developing the substrate with the latent image pattern formed in the above step. The manufacturing method also includes other known steps (for example, oxidation, deposition, vapor deposition, doping, planarization, etching, resist removal, dicing, bonding, and packaging). The method of manufacturing an article according to this embodiment is advantageous in at least one of the performance, quality, productivity, and production cost of the article compared to conventional methods.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-035418, filed Feb. 28, 2018, which is hereby incorporated by reference herein in its entirety.

What is claimed is:

1. An exposure apparatus that exposes a substrate, comprising:
   a stage configured to hold and move the substrate;
   a projection optical system configured to project a pattern of a mask onto the substrate held by the stage; and
   a controller configured to control exposures of the substrate in accordance with a step-and-repeat method while performing step movements of the stage and controlling a position of the stage in a first direction along an optical axis of the projection optical system, wherein the controller is configured to obtain a step size of the step movements, and determine a correction value for correcting the position of the stage in the first direction in accordance with the obtained step size.

2. The apparatus according to claim 1, wherein the controller is configured to determine a correction formula of the step size based on a plurality of correction formulas corresponding to a plurality of step sizes and determines the correction value by using the determined correction formula.

3. The apparatus according to claim 2, wherein the plurality of correction formulas include a correction formula expressing a relationship between a step size, a position of a shot region, and a correction value.

4. The apparatus according to claim 3, wherein the plurality of correction formulas include a correction formula expressing a relationship between a step direction, a step size, and a correction value.

5. The apparatus according to claim 2, wherein the controller is configured to determine the correction formula of the step size by interpolating parameters of correction formulas of two step sizes preceding and succeeding a step size among the plurality of step sizes.

6. The apparatus according to claim 5, wherein in a case in which the step size is smaller than the minimum step size of the plurality of step sizes, the controller determines the correction formula of the minimum size step as the correction formula of the step size, and
in a case in which the step size is larger than the maximum step size the plurality of step sizes, the controller determines the correction formula of the maximum step size as the correction formula of the step size.

7. An exposure method of exposing a substrate executed by an exposure apparatus having a stage configured to hold and move the substrate, and a projection optical system configured to project a pattern of a mask onto the substrate held by the stage, the apparatus performs exposures of the substrate in accordance with a step-and-repeat method while performing step movements of the stage and controlling a position of the stage in a first direction along an optical axis of the projection optical system, the method comprising:
obtaining a step size of the step movements;
determining a correction value for correcting the position of the stage in the first direction in accordance with the obtained step size;
measuring a position of the stage in the first direction after performing a step movement with the obtained step size;
reflecting the determined correction value on a drive command value of the stage for the control of the position of the stage in the first direction;
performing the control of the position of the stage in the first direction based on a measurement value obtained in the measuring and the drive command value in which the determined correction value is reflected; and
exposing the shot region after the completion of the control of the position of the stage in the first direction.

8. The method according to claim 7, further comprising determining, in advance, a correction formula of the step size based on a plurality of correction formulas corresponding to a plurality of step sizes, and determining the correction value by using the determined correction formula.

9. The method according to claim 8, wherein the plurality of correction formulas include a correction formula expressing a relationship between a step size, a position of a shot region, and a correction value.

10. The method according to claim 9, wherein the determining the correction value includes
performing actual measurement which repeatedly performing the following for each shot region for each of the plurality of step sizes:
(a) measuring the position of the stage in the first direction after performing a step movement with the step size,
(b) controlling driving of the stage in the first direction so that the position of the stage is close to a target position based on a result of the measurement, and
(c) measuring the position of the stage in the first direction after the completion of the control and calculating a drive residual that is a difference between the measured position and the target position and
calculating the plurality of correction formulas based on the drive residual of each shot region obtained for each of the plurality of step size by the actual measurement.

11. A method of manufacturing an article, comprising:
exposing a substrate by using an exposure apparatus; and
developing the substrate exposed in the exposing,
wherein an article is manufactured from the developed substrate,
wherein the exposure apparatus comprises:
a stage configured to hold and move the substrate;
a projection optical system configured to project a pattern of a mask onto the substrate held by the stage; and
a controller configured to control exposures of the substrate in accordance with a step-and-repeat method that sequentially exposes the substrate while performing step movements of the stage and controlling a position of the stage in a first direction along an optical axis of the projection optical system,
wherein the controller is configured to obtain a step size of the step movements to be used in the exposures in accordance with the step-and-repeat method, and determine a correction value for a drive command value of the stage in the control of the position of the stage in the first direction in accordance with the obtained step size.

12. The apparatus according to claim 1, wherein the controller is configured to determine the correction value in accordance with a positon of a shot region on the substrate.

13. The apparatus according to claim 1, wherein the controller is configured to determine the correction value in accordance with a step direction of the step movement.

14. The apparatus according to claim 1, wherein the step movement includes movement of the stage in a second direction intersecting with the first direction to move a shot region of the substrate to a position for measurement in the first direction.

15. The apparatus according to claim 1, wherein a plurality of correction formulas corresponding to each of a plurality of step sizes are obtained in advance, by controlling the position of the stage in the first direction so that the position of the stage is close to a target position, and checking a difference between the target position and the position of the stage in the first direction after the control, and the correction value corresponding to the obtained step size is determined based on at least one of the plurality of correction formulas.

16. The method according to claim 7, wherein a plurality of correction formula s corresponding to each of a plurality of step sizes are obtained in advance, by controlling the position of the stage in the first direction so that the position of the stage is close to a target position, and checking a difference between the target position of the position of the stage in the first direction after the control, and the correction value corresponding to the obtained step size is determined based on at least one of the plurality of correction formulas.

17. An exposure method for exposing a first substrate by an exposure apparatus in accordance with a step-and-repeat method, the exposure method comprising:
  a movement step of performing a step movement of a stage of the exposure apparatus on which a second substrate is held;
  a first detection step of detecting, after the step movement, a position of the second substrate on the stage in an optical axis direction that is a direction along an optical axis of a projection optical system of the exposure apparatus;
  a first control step of controlling a position of the stage in the optical axis direction so that the second substrate is close to a target position in the optical axis direction based on the position of the second substrate in the optical axis direction detected in the first detection step;
  a second detection step of detecting a position of the second substrate in the optical axis direction after the first control step;
  a determination step of determining a correction formula for obtaining a correction value to be used for controlling the position of the stage in the optical axis direction based on a difference between the position of the second substrate in the optical axis direction detected in the second detection step and the target position;
  a third detection step of performing a step movement of the stage on which the first substrate is held, and detecting a position of the first substrate on the stage in the optical axis direction after the step movement;
  a second control step of controlling the position of the stage in the optical axis direction so that the first substrate is close to the target position in the optical axis direction based on the position of the first substrate in the optical axis direction detected in the third detection step and the correction value obtained by using the correction formula determined in the determination step; and
  an exposure step of exposing the first substrate after the second control step.

18. The exposure method according to claim 17, wherein the correction formula is a formula for obtaining the correction value based on a position of an exposure region in a plane of the first substrate.

19. The exposure method according to claim 17, wherein the movement step, the first detection step, the first control step, and the second detection step are repeated while changing a step size of the step movement in the movement step, and the determination step determines a plurality of correction formulas in accordance with the step size.

20. The exposure method according to claim 19, wherein the second control step controls the position of the stage based on a correction formula corresponding to a step size of the step movement of the stage holding the first substrate among the plurality of correction formulas.

21. The exposure method according to claim 19, wherein the second control step controls the position of the stage based on a correction formula corresponding to a step size closest to a step size of the step movement of the stage holding the first substrate among the plurality of correction formulas.

22. The exposure method according to claim 19, wherein the second control step controls the position of the stage based on a first correction formula corresponding to a first step size of the step movement of the stage holding the first substrate among the plurality of correction formulas, wherein the first correction formula is obtained based on a second correction formula corresponding to a second step size larger than the first step size and a third correction formula corresponding to a third step size smaller than the first step size.

23. The exposure method according to claim 22, wherein the first correction formula is obtained by interpolating using the second correction formula and the third correction formula.

24. The exposure method according to claim 17, wherein the movement step, the first detection step, the first control step, and the second detection step are repeated while changing a step direction of the step movement in the movement step, and the determination step determines a plurality of correction formulas in accordance with the step direction.

25. The exposure method according to claim 24, wherein the second control step controls the position of the stage based on a correction formula corresponding to a step direction of the step movement of the stage holding the first substrate among the plurality of correction formulas.

26. The exposure method according to claim 17, wherein the movement step, the first detection step, the first control step, and the second detection step are repeated such that the first detection step and the second detection step detect a position of the second substrate in the optical axis direction at a plurality of positions in a plane of the second substrate, and the determination step determines a plurality of correction formulas based on a plurality of the differences corresponding to the plurality of positions.

27. The exposure method according to claim 17, wherein the stage performs the step movement in a direction along a plane perpendicular to the optical axis direction.

28. An exposure apparatus that exposes a first substrate in accordance with a step-and-repeat method,
  a stage configured to hold and move a substrate;
  a projection optical system for projecting a pattern of a mask onto the substrate held on the stage;
  a detector configured to detect a position in an optical axis direction of the projection optical system of the substrate held on the stage; and
  a controller configured to control exposures of the substrate;
  wherein the controller is configured to:
  control the stage on which a second substrate is held to perform a step movement;
  perform, after the step movement, a first detection for detecting a position of the second substrate on the stage in an optical axis direction that is a direction along an optical axis of the projection optical system;
  perform a first control for controlling a position of the stage in the optical axis direction so that the second substrate is close to a target position in the optical axis direction based on the detected position of the second substrate in the optical axis direction;
  perform, after the first control, a second detection for detecting a position of the second substrate in the optical axis direction;
  determine a correction formula for obtaining a correction value to be used for controlling the position of the stage in the optical axis direction based on a difference between the position of the second substrate in the optical axis direction detected in the second detection and the target position;
  perform a third detection for performing a step movement of the stage on which the first substrate is held, and detecting a position of the first substrate on the stage in the optical axis direction after the step movement;

perform a second control for controlling the position of the stage in the optical axis direction so that the first substrate is close to the target position in the optical axis direction based on the position of the first substrate in the optical axis direction detected by the third detection and the correction value obtained by using the determined correction formula; and expose the first substrate after the second control.

29. A determination method for determining a correction formula for obtaining a correction value to be used for controlling a position of a stage in an optical axis direction of a projection optical system of an exposure apparatus for exposing a substrate in accordance with a step-and-repeat method, the determination method comprising:
- a movement step of performing a step movement of the stage on which the substrate is held;
- a first detection step of detecting, after the step movement, a position of the substrate on the stage in the optical axis direction;
- a first control step of controlling a position of the stage in the optical axis direction so that the substrate is close to a target position in the optical axis direction based on the position of the substrate in the optical axis direction detected in the first detection step;
- a second detection step of detecting a position of the substrate in the optical axis direction after the first control step; and
- a determination step of determining the correction formula based on a difference between the position of the substrate in the optical axis direction detected in the second detection step and the target position.

30. An article manufacturing method for exposing a first substrate by an exposure apparatus in accordance with a step-and-repeat method, and manufacturing an article from the first substrate, the article manufacturing method comprising:
- a movement step of performing a step movement of a stage of the exposure apparatus on which a second substrate is held;
- a first detection step of detecting, after the step movement, a position of the second substrate on the stage in an optical axis direction that is a direction along an optical axis of a projection optical system of the exposure apparatus;
- a first control step of controlling a position of the stage in the optical axis direction so that the second substrate is close to a target position in the optical axis direction based on the position of the second substrate in the optical axis direction detected in the first detection step;
- a second detection step of detecting a position of the second substrate in the optical axis direction after the first control step;
- a determination step of determining a correction formula for obtaining a correction value to be used for controlling the position of the stage in the optical axis direction based on a difference between the position of the second substrate in the optical axis direction detected in the second detection step and the target position;
- a third detection step of performing a step movement of the stage on which the first substrate is held, and detecting a position of the first substrate on the stage in the optical axis direction after the step movement;
- a second control step of controlling the position of the stage in the optical axis direction so that the first substrate is close to the target position in the optical axis direction based on the position of the first substrate in the optical axis direction detected in the third detection step and the correction value obtained by using the correction formula determined in the determination step;
- an exposure step of exposing the first substrate after the second control step;
- a developing step of developing the first substrate exposed in the exposure step; and
- a manufacturing step of manufacturing the first substrate developed in the developing step.

* * * * *